US012588340B2

(12) United States Patent
Choi et al.

(10) Patent No.: US 12,588,340 B2
(45) Date of Patent: Mar. 24, 2026

(54) DISPLAY DEVICE

(71) Applicant: Samsung Display Co., Ltd., Yongin-si (KR)

(72) Inventors: Yoonsun Choi, Hwaseong-si (KR); Seung-Hwan Cho, Yongin-si (KR); Jiseon Lee, Hwaseong-si (KR); Wonsuk Choi, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 410 days.

(21) Appl. No.: 18/114,240

(22) Filed: Feb. 25, 2023

(65) Prior Publication Data

US 2023/0282794 A1      Sep. 7, 2023

(30) Foreign Application Priority Data

Mar. 7, 2022    (KR) ........................ 10-2022-0028685

(51) Int. Cl.
H10H 20/857          (2025.01)
(52) U.S. Cl.
CPC ................................. H10H 20/857 (2025.01)
(58) Field of Classification Search
CPC ........................... H10H 20/857; H10K 59/131
See application file for complete search history.

(56) References Cited

U.S. PATENT DOCUMENTS

2019/0318690 A1* 10/2019 Lee ....................... G09G 3/3233
2020/0089369 A1* 3/2020 Bang ..................... G06F 3/0416

2020/0105206 A1* 4/2020 Jo .......................... H10K 59/88
2020/0363905 A1* 11/2020 Jo .......................... G06F 3/0448
2021/0035496 A1* 2/2021 Cho ...................... H10D 86/441
2021/0183987 A1* 6/2021 Lee ....................... H10K 59/88
2021/0242423 A1 8/2021 Lee
2021/0280641 A1* 9/2021 Bang ................... H10K 50/844

FOREIGN PATENT DOCUMENTS

| CN | 109065571 A | 12/2018 |
| KR | 102079256 B1 | 2/2020 |
| KR | 1020210099246 A | 8/2021 |
| KR | 1020210111926 A | 9/2021 |

* cited by examiner

*Primary Examiner* — Jeff W Natalini
*Assistant Examiner* — Rose Keagy
(74) *Attorney, Agent, or Firm* — CANTOR COLBURN LLP

(57)                    ABSTRACT

A display device includes: a substrate including a display area, a first non-display area, a second non-display area, and a bending area and extending in a second direction, a first inorganic film disposed in the display area, the first non-display area, the second non-display area and a portion of the bending area on the substrate, a second inorganic film disposed on the first inorganic film and overlapping the display area, the first non-display area, and the second non-display area in a plan view, a first power line disposed on the second inorganic film and overlapping the first non-display area in a plan view, and a first dummy line extending from the first power line, disposed on the first inorganic film in the bending area, covering a first side surface of the second inorganic film in the first non-display area, and extending in the second direction.

19 Claims, 19 Drawing Sheets

F I G .  4
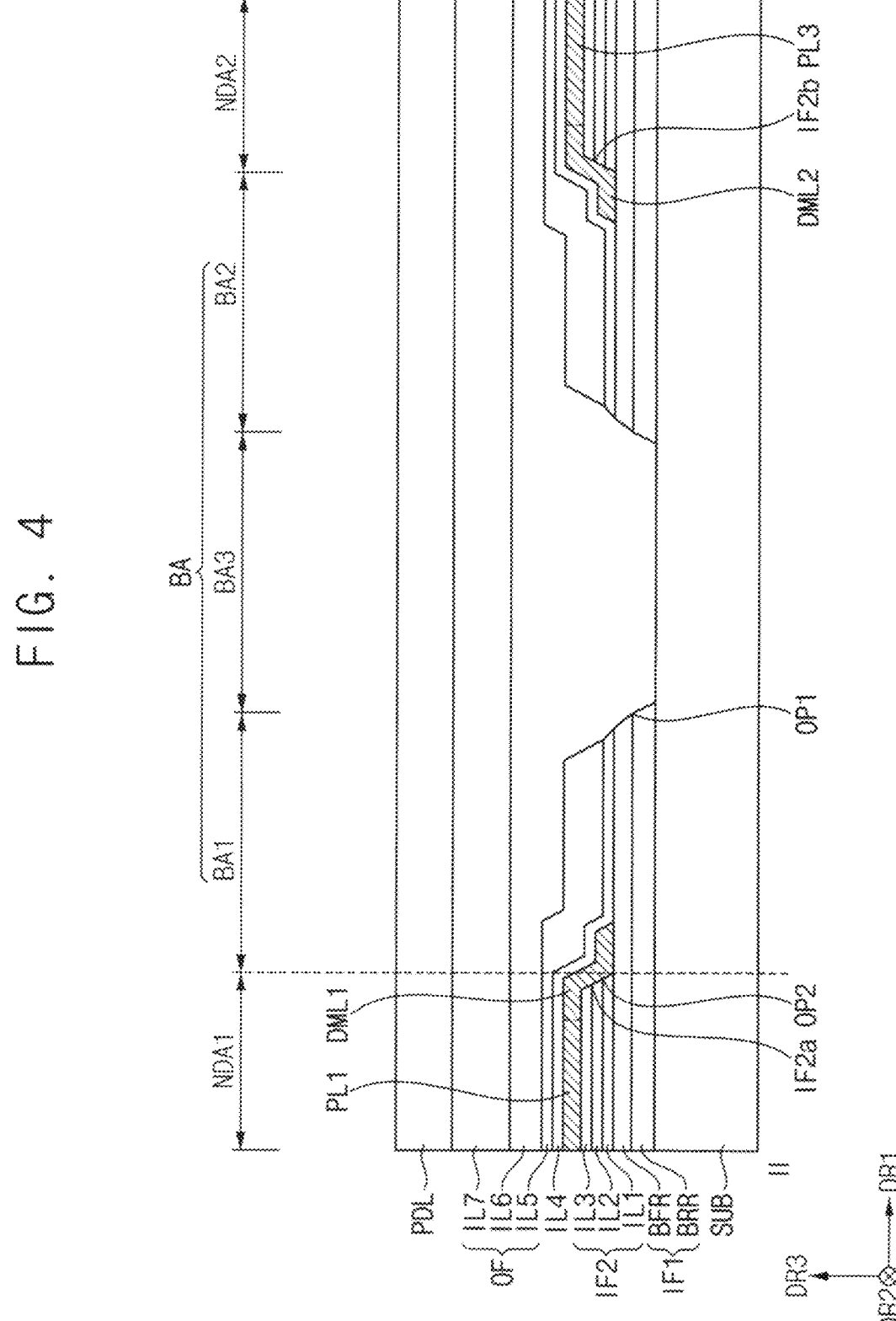

DISPLAY DEVICE

This application claims priority to Korean Patent Application No. 10-2022-0028685, filed on Mar. 7, 2022, and all the benefits accruing therefrom under 35 U.S.C. § 119, the content of which in its entirety is herein incorporated by reference.

BACKGROUND

1. Field

Embodiments relate to a display device. More particularly, embodiments relate to the display device and a method of manufacturing the display area.

2. Description of the Related Art

The display device is a device for displaying an image for providing visual information to a user. The display device may include a display area which displays a screen and a non-display area which does not display a screen.

The non-display area is an area which does not display a screen, and lines and drivers may be disposed. Efforts to reduce an area of the non-display area in the display device are continuing. A display panel or the like inside the display device includes a bending area, and the bending area may be bent. As the bending area is bent, a portion of the non-display area is positioned on a rear surface of the display device, so that the area of the non-display area may be reduced.

SUMMARY

Embodiments provide a display device with improved reliability.

A display device according to an embodiment includes: a substrate including a display area, a first non-display area adjacent to the display area, a second non-display area spaced apart from the first non-display area in a first direction, and a bending area disposed between the first non-display area and the second non-display area and extending in a second direction crossing the first direction, a first inorganic film disposed in the display area, the first non-display area, the second non-display area and a portion of the bending area on the substrate, a second inorganic film disposed on the first inorganic film and overlapping the display area, the first non-display area, and the second non-display area in a plan view, a first power line disposed on the second inorganic film and overlapping the first non-display area in a plan view, and a first dummy line extending from the first power line, disposed on the first inorganic film in the bending area, covering a first side surface of the second inorganic film in the first non-display area, and extending in the second direction.

In an embodiment, the first dummy line may be monolithic with the first power line.

In an embodiment, the first dummy line may extend along the bending area in the second direction, and a length of the first dummy line in the second direction may be the same as a length of the bending area in the second direction.

In an embodiment, the second inorganic film may expose the first inorganic film in the bending area, and the first inorganic film may expose the substrate in the bending area.

In an embodiment, a length of a portion of the first dummy line overlapping the bending area in the first direction may be less than a length of a portion of the first inorganic film overlapping the bending area in the first direction.

In an embodiment, the display device may further include a second power line disposed in the first non-display area on the second inorganic film and spaced apart from the first power line in the plan view.

In an embodiment, the second power line may be disposed in the same layer as the first power line, and the second power line may be spaced apart from the first dummy line in the plan view.

In an embodiment, the second power line may overlap the first dummy line in the first direction.

In an embodiment, the display device may further include an organic film disposed on the first power line and overlapping the display area, the first non-display area, the second non-display area, and the bending area.

In an embodiment, the organic film may cover the first dummy line, the first inorganic film and the second inorganic film.

In an embodiment, the display device may further include a third power line disposed on the second inorganic film, overlapping the second non-display area, disposed on the same layer as the first power line, and spaced apart from the first power line in the first direction in the plan view.

In an embodiment, the display device may further include a second dummy line extending from the third power line, disposed on the first inorganic film in the bending area, covering a second side surface of the second inorganic film spaced apart from the first side surface in the second non-display area, and extending in the second direction.

In an embodiment, the second dummy line may be spaced apart from the first dummy line in the first direction.

In an embodiment, the second dummy line may extend along the bending area in the second direction, and a length of the second dummy line in the second direction may be the same as a length of the first dummy line in the second direction.

A display device according to an embodiment includes: a substrate including a display area, a first non-display area adjacent to the display area, a second non-display area spaced apart from the first non-display area in a first direction, and a bending area disposed between the first non-display area and the second non-display area and extending in a second direction crossing the first direction, a first inorganic film disposed in the display area, the first non-display area, the second non-display area, and a portion of the bending area on the substrate and defining a first opening extending in the second direction in the bending area, a second inorganic film in the display area, the first non-display area, and the second non-display area on the first inorganic film and defining a second opening extending in the second direction in the bending area, a first power line disposed in the first non-display area on the second inorganic film and a first dummy line extending from the first power line, disposed on the first inorganic film in the bending area, covering a first side surface of the second opening in the first non-display area, and extending in the second direction.

In an embodiment, the first opening and the second opening may overlap each other in the bending area in a plan view.

In an embodiment, the first dummy line may be spaced apart from the first opening.

In an embodiment, the display device may further include a second power line disposed in the same layer as the first power line and spaced apart from the first power line, a third power line disposed in the same layer as the first power line and spaced apart from the first power line and the second power line and a second dummy line extending from the third power line, disposed on the first inorganic film in the bending area, covering a second side surface of the second opening in the second non-display area, and extending in the second direction.

In an embodiment, the second dummy line is spaced apart from the first opening, the second dummy line may be spaced apart from the first dummy line, and the first opening may be interposed between the first dummy line and the second dummy line.

In an embodiment, the display device may further include an organic film disposed on the first power line and overlapping the display area, the first non-display area, the second non-display area, and the bending area, and the organic film may be disposed in the first opening and the second opening and contacts the substrate in the bending area.

In the display device according to embodiments, as the first dummy line is disposed in a boundary between the first non-display area and the bending area, and the second dummy line is disposed in a boundary between the bending area and the second non-display area, the residual metal film may not remain in the boundary between the first non-display area and the bending area and the boundary between the second non-display area and the bending area. Accordingly, a short circuit due to the residual metal film may be prevented, and thus, the reliability of the display device may be effectively improved.

BRIEF DESCRIPTION OF THE DRAWINGS

FIG. 4 is a cross-sectional view taken along line II-IF of FIG. 3.

FIG. 5 is a cross-sectional view taken along line of FIG. 3.

FIG. 9 is a cross-sectional view taken along line V-V' of FIG. 7.

FIG. 11 is a cross-sectional view illustrating another example of FIG. 9.

DETAILED DESCRIPTION

Figure 1:
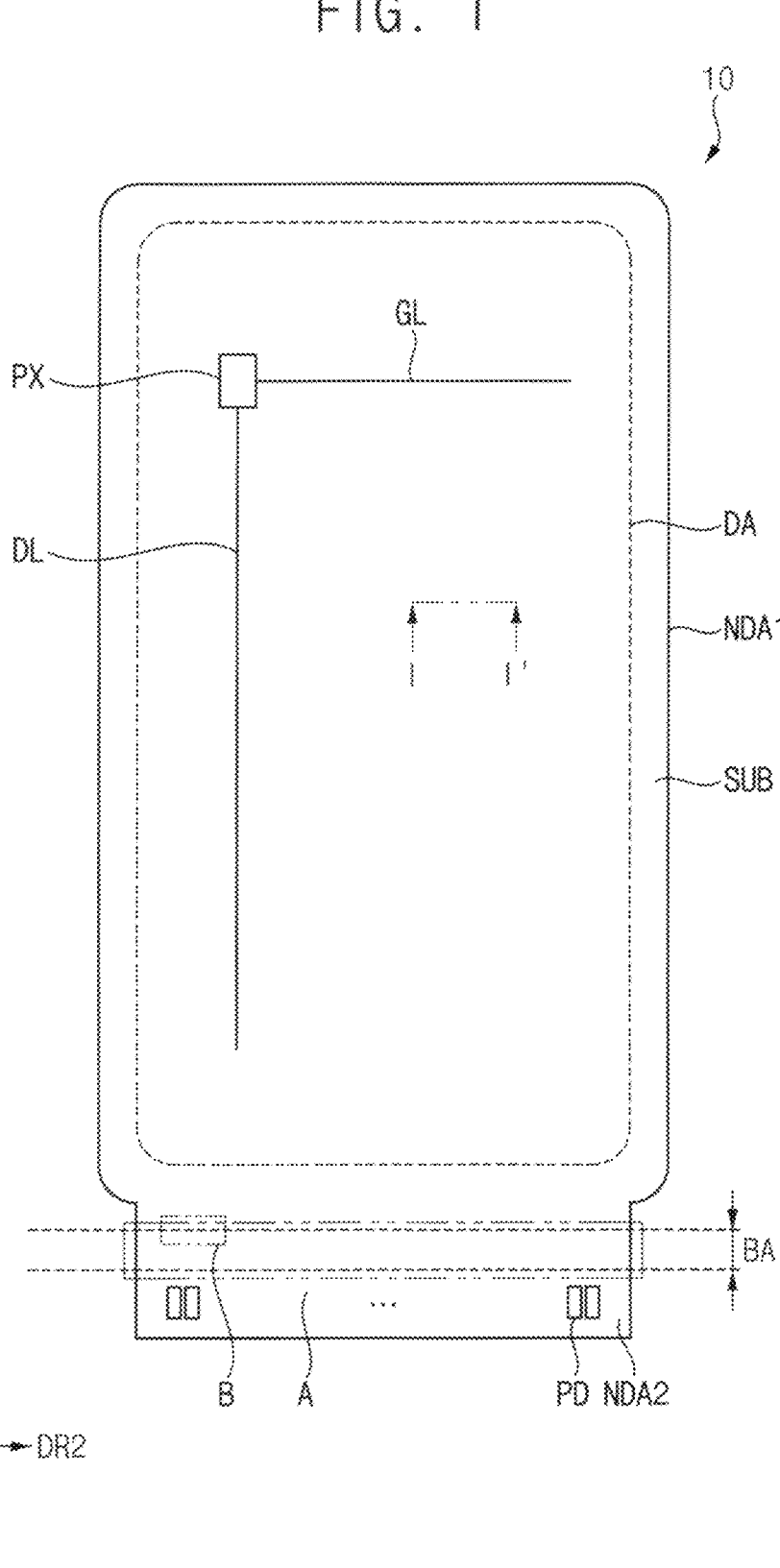
FIG. 1 is a plan view illustrating a display device according to an embodiment.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Hereinafter, display devices in accordance with embodiments will be described in more detail with reference to the accompanying drawings. The same reference numerals are used for the same components in the drawings, and redundant descriptions of the same components will be omitted.

FIG. 1 is a plan view illustrating a display device according to an embodiment. As used herein, the "plan view" is a view from a third direction DR3, and the third direction DR3 is a thickness direction of the display device, and perpendicular to the first direction DR1 and the second direction DR2.

Referring to FIG. 1, a display device 10 may include a substrate SUB. The substrate SUB may include a display area DA, a first non-display area NDA1, a second non-display area NDA2, and a bending area BA.

The display area DA may display a screen. A plurality of pixels PX which emit light and lines which transmit a driving signal to the pixels PX may be disposed in the display area DA. Examples of the lines may include gate lines GL and data lines DL. The gate lines GL may transmit a gate signal, and the data lines DL may transmit a data signal.

The first non-display area NDA1 may be an area which does not display a screen. The lines and drivers for driving may be disposed in the first non-display area NDA1. For example, a gate driver and a light emitting driver may be disposed in the first non-display area NDA1. The first non-display area NDA1 may be adjacent to the display area DA and may surround at least one surface of the display area DA. However, embodiments according to the invention are not limited thereto, and the screen may be displayed in the first non-display area NDA1 in another embodiment.

The second non-display area NDA2 may be spaced apart from the first non-display area NDA1 in a first direction DR1. Similarly, the second non-display area NDA2 may be an area which does not display a screen. The lines and the drivers for driving may be disposed in the second non-display area NDA2. For example, a pad unit PD including pads and a driving chip may be disposed in the second non-display area NDA2. However, embodiments according to the invention are not limited thereto, and the pad unit PD and a circuit board on which the driving chip is mounted may be connected in the second non-display area NDA2 in another embodiment.

The bending area BA may be disposed between the first non-display area NDA1 and the second non-display area NDA2. The bending area BA may extend in a second direction DR2 crossing the first direction DR1. The bending area BA may be bent to reduce an area of the non-display areas. Accordingly, as the bending area BA is bent, the second non-display area NDA2 may be positioned on a rear surface of the display device 10, so that an area of the non-display area of the display device 10 may be reduced.

Figure 2:
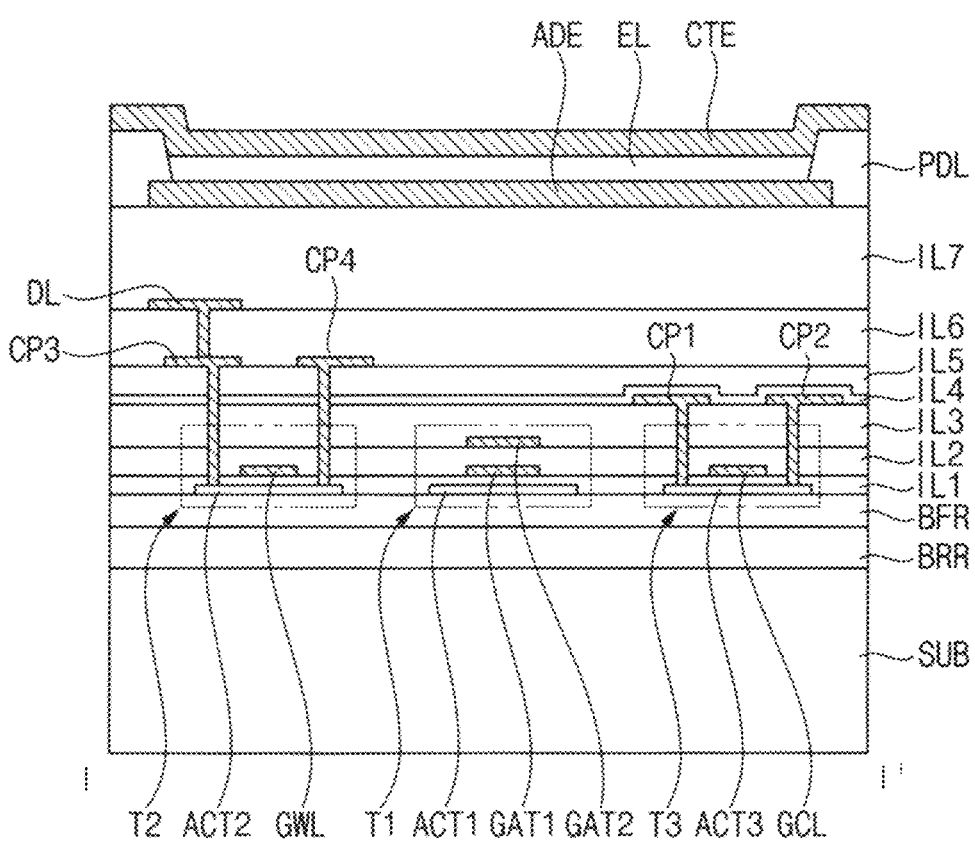
FIG. 2 is a cross-sectional view taken along line I-I' of FIG. 1.

FIG. 2 is a cross-sectional view taken along line I-I' of FIG. 1.

Referring to FIGS. 1 and 2, the display device 10 may include the substrate SUB, a barrier layer BRR, a buffer layer BFR, a first active pattern ACT1, a second active pattern ACT2, and a first insulation layer IL1, a first gate electrode GAT1, a first gate line GWL, a second insulation layer IL2, a second gate electrode GAT2, a third insulation layer IL3, a third active pattern ACT3, a fourth insulation layer IL4, a second gate line GCL, a fifth insulation layer IL5, a first connection pattern CP1, a second connection pattern CP2, a third connection pattern CP3, a fourth connection pattern CP4, a sixth insulation layer IL6, a data line DL, a seventh insulation layer IL7, an anode electrode ADE, a pixel defining layer PDL, and a light emitting layer EL, and a cathode electrode CTE.

The substrate SUB may be formed of glass, quartz, plastic, or the like. Examples of the material which may be used as the plastic include polyimide ("PI"), polyacrylate, polymethylmethacrylate ("PMMA"), polycarbonate ("PC"), polyethylenenaphthalate ("PEN"), polyvinylidene chloride, polyvinylidene difluoride ("PVDF"), polystyrene, ethylene vinylalcohol copolymer, polyethersulphone ("PES"), polyetherimide ("PEI"), polyphenylene sulfide ("PPS"), polyallylate, tri-acetyl cellulose ("TAC"), cellulose acetate propionate ("CAP"), etc. These materials may be used alone or in combination.

The barrier layer BRR may be disposed on the substrate SUB. The barrier layer BRR may prevent foreign substances from penetrating under the substrate SUB. The barrier layer BRR may be formed of an inorganic material. Examples of the inorganic material may include silicon oxide, silicon nitride, silicon oxynitride, etc. These materials may be used alone or in combination.

The buffer layer BFR may be disposed on the barrier layer BRR. In an embodiment, the buffer layer BFR may be formed of an inorganic material. Examples of the inorganic material may include silicon oxide, silicon nitride, silicon oxynitride, etc. These materials may be used alone or in combination. The buffer layer BFR may prevent metal atoms or impurities from penetrating into the first and second active patterns ACT1 and ACT2. In addition, the buffer layer BFR may control a heat supply rate during a crystallization process to form the first and second active patterns ACT1 and ACT2.

The first to third active patterns ACT1, ACT2, and ACT3 may be disposed on the buffer layer BFR. In an embodiment, the first to third active patterns ACT1, ACT2, and ACT3 may be formed of a silicon semiconductor material. Examples of the silicon semiconductor material may include amorphous silicon and polycrystalline silicon. These materials may be used alone or in combination.

The first insulation layer IL1 may be disposed on the buffer layer BFR and may cover the first to third active patterns ACT1, ACT2, and ACT3. In an embodiment, the first insulation layer IL1 may be formed of an inorganic material. Examples of the inorganic material include silicon oxide, silicon nitride, silicon oxynitride, etc. These materials may be used alone or in combination.

The first gate electrode GAT1, the first gate line GWL, and the second gate line GCL may be disposed on the first insulation layer IL1. In an embodiment, the first gate electrode GAT1 may overlap the first active pattern ACT1 in a plan view. The first active pattern ACT1 and the first gate electrode GAT1 may constitute a first transistor T1. In an embodiment, the first gate line GWL may overlap the second active pattern ACT2. The second active pattern ACT2 and the first gate line GWL may constitute a second transistor T2. In an embodiment, the second gate line GCL may overlap the third active pattern ACT3. The third active pattern ACT3 and the second gate line GCL may constitute a third transistor T3.

In an embodiment, the first gate electrode GAT1, the first gate line GWL, and the second gate line GCL may be formed of a metal, an alloy, a conductive metal oxide, a transparent conductive material, or the like. Examples of materials which can be used as the first gate electrode GAT1, the first gate line GWL, and the second gate line GCL may include silver (Ag), an alloy containing silver, molybdenum (Mo), alloys containing molybdenum, aluminum (Al), alloys containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide ("ITO"), indium zinc oxide ("IZO"), or the like. These materials may be used alone or in combination.

The second insulation layer IL2 may be disposed on the first insulation layer IL1 and may cover the first gate electrode GAT1, the first gate line GWL, and the second gate line GCL. In an embodiment, the second insulation layer IL2 may be formed of an inorganic material.

The second gate electrode GAT2 may be disposed on the second insulation layer IL2. In an embodiment, the second gate electrode GAT2 may overlap the first gate electrode GAT1 in a plan view. The first gate electrode GAT1 and the second gate electrode GAT2 may constitute a storage capacitor. In an embodiment, the second gate electrode GAT2 may be formed of a metal, an alloy, a conductive metal oxide, a transparent conductive material, or the like.

The third insulation layer IL3 may be disposed on the second insulation layer IL2 and cover the second gate electrode GAT2. In an embodiment, the third insulation layer IL3 may be formed of an inorganic material.

The first connection pattern CP1 and the second connection pattern CP2 may be disposed on the third insulation layer IL3. The first and second connection patterns CP1 and CP2 may contact the third active pattern ACT3. The first and second connection patterns CP1 and CP2 may be formed of a metal, an alloy, a conductive metal oxide, a transparent conductive material, or the like.

The fourth insulation layer IL4 may be disposed on the third insulation layer IL3. The fourth insulation layer IL4 may cover and protect the first and second connection patterns CP1 and CP2. In an embodiment, the fourth insulation layer IL4 may be formed of an insulating material.

The fifth insulation layer IL5 may be disposed on the fourth insulation layer IL4. In an embodiment, the fifth insulation layer IL5 may be formed of an organic material.

The third and fourth connection patterns CP3 and CP4 may be disposed on the fifth insulation layer IL5. The third and fourth connection patterns CP3 and CP4 may contact the third active pattern ACT3. In an embodiment, the third and fourth connection patterns CP1, CP2, CP3, and CP4 may be formed of a metal, an alloy, a conductive metal oxide, a transparent conductive material, or the like.

The sixth insulation layer IL6 may be disposed on the fifth insulation layer IL5 and may cover the third and fourth connection patterns CP3 and CP4. In an embodiment, the sixth insulation layer IL6 may be formed of an organic material. Examples of the organic material may include photoresists, polyacrylic resins, polyimide resins, acrylic resins, and the like. These materials may be used alone or in combination. Accordingly, the sixth insulation layer IL6 may have a substantially flat top surface.

The data line DL may be disposed on the sixth insulation layer IL6. In an embodiment, the data line DL may contact the third connection pattern CP3. A data signal may be provided to the data line DL. In an embodiment, the data line DL may be formed of a metal, an alloy, a conductive metal oxide, a transparent conductive material, or the like.

The seventh insulation layer IL7 may be disposed on the sixth insulation layer IL6 and may cover the data line DL. In an embodiment, the seventh insulation layer IL7 may be formed of an organic material.

The anode electrode ADE may be disposed on the seventh insulation layer IL7. In an embodiment, the anode electrode ADE may be formed of a metal, an alloy, a conductive metal oxide, a transparent conductive material, or the like.

The pixel defining layer PDL may be disposed on the seventh insulation layer IL7. An opening exposing the anode electrode ADE may be formed in the pixel defining layer PDL. In an embodiment, the pixel defining layer PDL may be formed of an organic material.

The light emitting layer EL may be disposed on the anode electrode ADE. The light emitting layer EL may include an organic material emitting light. In an embodiment, the light emitted from the light emitting layer EL may be emitted toward the cathode electrode CTE.

The cathode electrode CTE may be disposed on the light emitting layer EL. The cathode electrode CTE may receive a power supply voltage.

The light emitting layer EL may emit light based on a voltage difference between the anode electrode ADE and the cathode electrode CTE.

Figure 3:
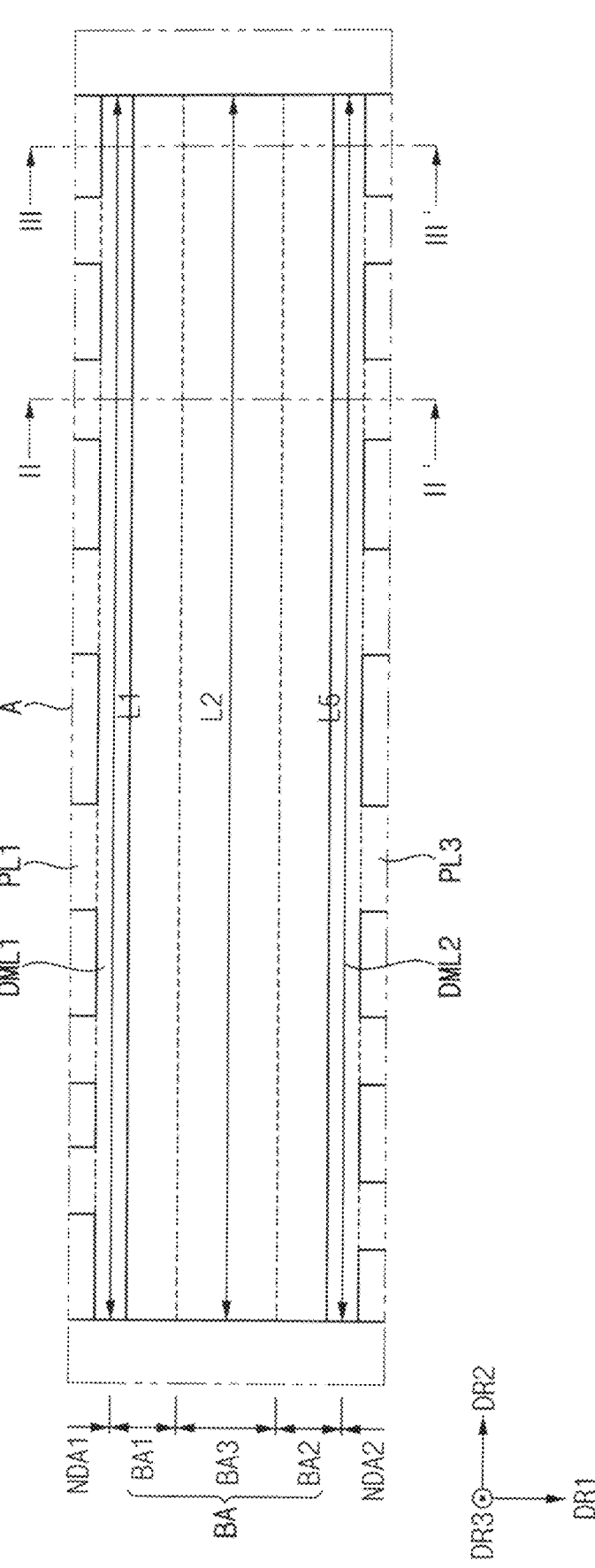
FIG. 3 is a plan view illustrating an enlarged area A of FIG. 1.
Figure 5:
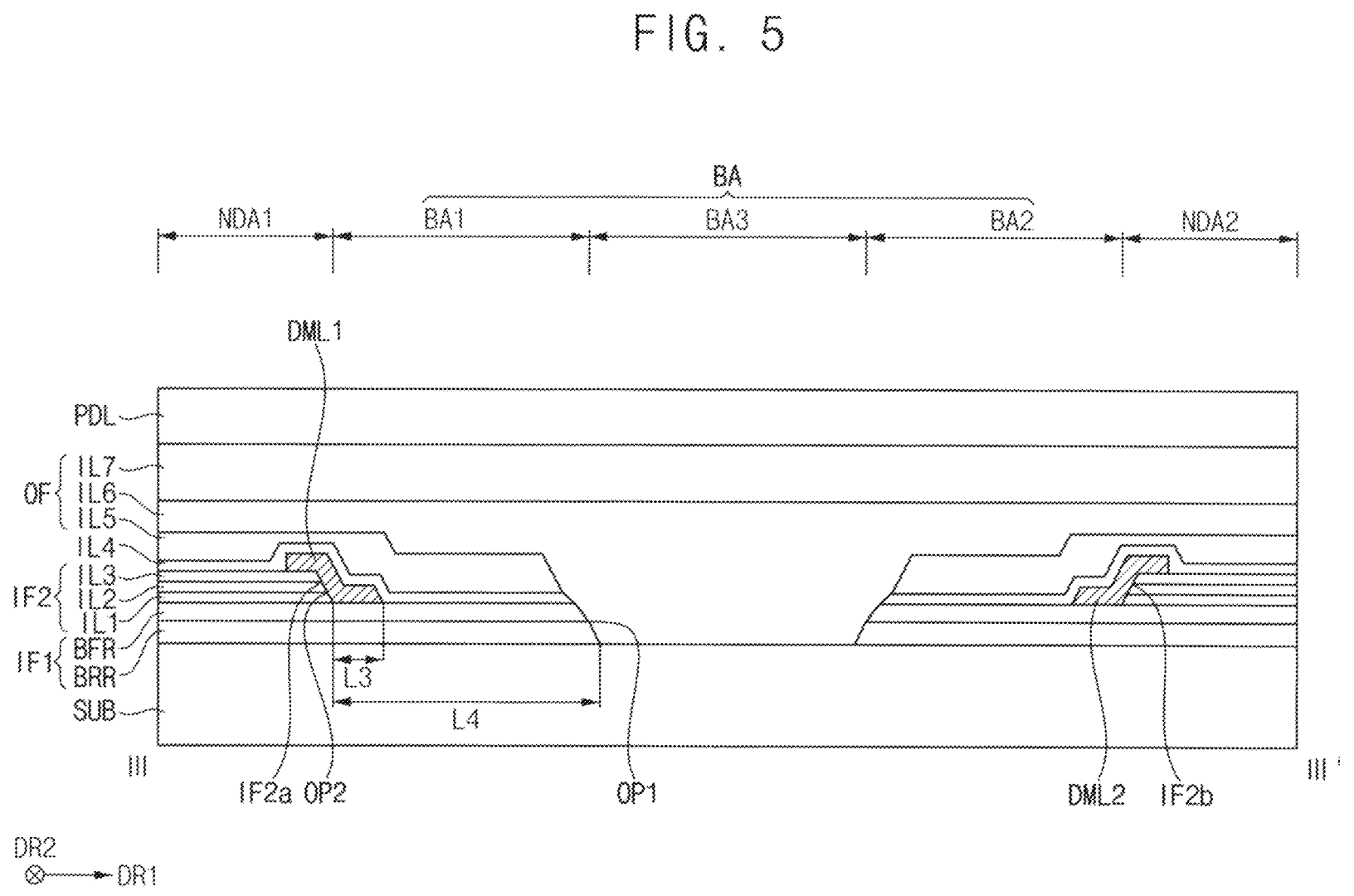

FIG. 3 is a plan view illustrating an enlarged area A of FIG. 1. FIG. 4 is a cross-sectional view taken along line II-IF of FIG. 3. FIG. 5 is a cross-sectional view taken along line of FIG. 3.

In an embodiment, for example, FIG. 3 may be a plan view illustrating only a first power line PL1 and a first dummy line DML1.

Referring to FIGS. 1 to 5, the display device 10 may further include a first power line PL1, a second power line (e.g., refer to the second power line PL2 of FIG. 6), and a third power line PL3, a first dummy line DML1, a second dummy line DML2, first lines (e.g., first lines LN1 of FIG. 6), second lines (e.g., second lines LN2 of FIG. 6) and third lines.

The barrier layer BRR, the buffer layer BFR, the first insulation layer IL1, the second insulation layer IL2, the third insulation layer IL3, the fourth insulation layer IL4, the fifth insulation layer IL5, the sixth insulation layer IL6, the seventh insulation layer IL7, and the pixel defining layer PDL may be disposed to extend from the display area to the first non-display area NDA1.

In an embodiment, the barrier layer BRR and the buffer layer BFR may form a first inorganic film IF1. The first insulation layer IL1, the second insulation layer IL2, and the third insulation layer IL3 may form a second inorganic film IF2. The fifth insulation layer IL5, the sixth insulation layer IL6, and the seventh insulation layer IL7 may form an organic film OF. However, embodiments according to the invention are not limited thereto. Hereinafter, the first inorganic film IF1, the second inorganic film IF2, and the organic film OF may be described as a reference.

In an embodiment, the bending area BA may include a first bending area BA1 adjacent to the first non-display area NDA1, a second bending area BA2 adjacent to the second non-display area NDA2, and a third bending area BA3 disposed between the first bending area BA1 and the second bending area BA2.

The first inorganic film IF1 may be disposed on the substrate SUB. The first inorganic film IF1 may be entirely disposed in the display area DA, the first non-display area NDA1, and the second non-display area NDA2. The first inorganic film IF1 may be disposed on a portion of the bending area BA. For example, the first inorganic film IF1 may be disposed to overlap the first bending area BA1 and the second bending area BA2. The first inorganic film IF1 may not overlap the third bending area BA3 in a plan view. Accordingly, in the third bending area BA3, the first inorganic film IF1 may expose the substrate SUB.

In an embodiment, the first inorganic film IF1 may define a first opening OP1 extending in the second direction DR2 in the bending area BA.

The second inorganic film IF2 may be disposed on the first inorganic film IF1. The second inorganic film IF2 may overlap the display area DA, the first non-display area NDA1, and the second non-display area NDA2. The second inorganic film IF2 may not overlap the bending area BA in a plan view. Accordingly, the second inorganic film IF2 may expose the first inorganic film IF1 in the bending area BA. For example, the second inorganic film IF2 may expose the first inorganic film IF1 in the first bending area BA1 and the second bending area BA2.

In an embodiment, the second inorganic film IF2 may define a second opening OP2 extending in the second direction DR2 in the bending area BA. The second opening OP2 may overlap the first opening OP1 in a plan view. A length of the first opening OP1 in the first direction DR1 may be less than a length of the second opening OP2 in the first direction DR1. Accordingly, an area of the first opening OP1 may be less than an area of the second opening OP2.

Accordingly, the bending area BA may be defined as an area in which the second inorganic film IF2 is not disposed. Also, the third bending area BA3 may be defined as an area in which the first inorganic film IF1 is not disposed. However, embodiments according to the invention are not limited thereto.

The first power line PL1 may transmit a first power voltage to the pixels PX. The first power line PL1 may be connected to the third power line PL3 through the first lines (e.g., the first lines LN1 of FIG. 7). That is, the first power line PL1 and the third power line PL3 may be connected through the first lines. However, embodiments according to the invention are not limited thereto, and the first lines may be connected to the pad unit PD in another embodiment.

The first power line PL1 may be disposed on the second inorganic film IF2. The first power line PL1 may overlap the first non-display area NDA1 in a plan view. The first power line PL1 may be disposed on the same layer as the first conductive pattern CP1 and the second conductive pattern CP2 in the display area DA.

In an embodiment, the first dummy line DML1 may extend from the first power line PL1. That is, the first dummy line DML1 may be integrally formed (i.e., monolithic) with the first power line PL1. For example, the first dummy line DML1 may be connected to the first power line PL1 in six portions. However, embodiments according to the invention are not limited thereto. The first dummy line DML1 may extend in the second direction DR2 along the bending area BA in another embodiment.

A length L1 of the first dummy line DML1 in the second direction DR2 may be substantially the same as a length L2 of the bending area BA in the second direction DR2. Accordingly, the first dummy line DML1 may cover the entirety of a boundary between the first non-display area NDA1 and the bending area BA. However, embodiments according to the invention are not limited thereto, and the length L1 of the first dummy line DML may be smaller than the length L2 of the bending area BA in another embodiment.

The first dummy line DML1 may be disposed on the first inorganic film IF1 in the bending area BA. The first dummy line DML1 may cover a first side surface IF2a of the second inorganic film IF2 in the first non-display area NDA1.

A length L3 of a portion of the first dummy line DML1 overlapping with the bending area BA in the first direction DR1 may less than a length L4 of a portion of the first inorganic film IF1 overlapping the bending area BA in the first direction DR1. That is, the first dummy line DML1 may only partially overlap the first inorganic film IF1. Accordingly, the first dummy line DML1 may expose the first inorganic film IF1 in the first bending area BA1.

The first dummy line DML1 may cover a side surface of the second opening OP2 in the first non-display area NDA1. The side surface of the second opening OP2 may be substantially the same as the first side surface IF2a of the second inorganic film IF2. Also, the first dummy line DML1 may be spaced apart from the first opening OP1.

The third power line PL3 may transfer the first power voltage to the pixels PX. The third power line PL3 may be connected to the pad unit PD through the third lines.

The third power line PL3 may be disposed on the second inorganic film IF2. The third power line PL3 may overlap the second non-display area NDA2 in a plan view. The third power line PL3 may be disposed on the same layer as the first power line PL1. The third power line PL3 may be spaced apart from the first power line PL1 in a plan view. For example, the third power line PL3 may be spaced apart from the first power line PL1 in the first direction DR1.

The second dummy line DML2 may be spaced apart from the first dummy line DML1 in the first direction DR1. The second dummy line DML2 may extend from the third power line PL3. For example, the second dummy line DML2 may be connected to the third power line PL3 in six portions. However, embodiments according to the invention are not limited thereto.

The second dummy line DML2 may be disposed on the first inorganic film IF1 in the bending area BA. The second dummy line DML2 may cover a second side surface IF2b of the second inorganic film IF2 in the second non-display area NDA2. The second side surface IF2b of the second inorganic film IF2 may be spaced apart from the first side surface IF2a of the second inorganic film IF2 and may overlap the second non-display area NDA2 in a plan view. The second dummy line DML2 may extend along the bending area BA in the second direction DR2 like the first dummy line DML1.

A length L5 of the second dummy line DML2 in the second direction DR2 may be substantially the same as a length L1 of the first dummy line DML1 in the second direction DR2. For example, a shape of the second dummy line DML2 may be substantially symmetrical to a shape of the first dummy line DML1. However, the shape of the second dummy line DML2 is not limited thereto.

The organic film OF may be disposed on the first power line PL1 and the second power line PL2. The organic film OF may overlap the entirety of the display area DA, the first non-display area NDA1, the second non-display area NDA2, and the bending area BA. In addition, the organic film OF may cover the entirety of the first dummy line DML1, the second dummy line DML2, the first inorganic film IF1, and the second inorganic film IF2.

In an embodiment, the organic film OF may be disposed in the first opening OP1 and the second opening OP2. The organic film OF may be disposed on the second inorganic film IF2 in the first non-display area NDA1 and overlap the first inorganic film IF1 in the first bending area BA1 in a plan view. The organic film OF may contact the substrate SUB in the third bending area BA3.

In an embodiment, as the first dummy line DML1 is disposed in a boundary between the first non-display area NDA1 and the bending area BA, and the second dummy line DML2 is disposed in the boundary between the bending area BA and the second non-display area NDA2, the boundary between the first non-display area NDA1 and the bending area BA and the boundary between the second non-display area NDA2 and the bending area BA may not remain residual metal film. Accordingly, a short circuit caused by the residual metal film may be prevented, and thus, a reliability of the display device 10 may be improved.

Figure 6:
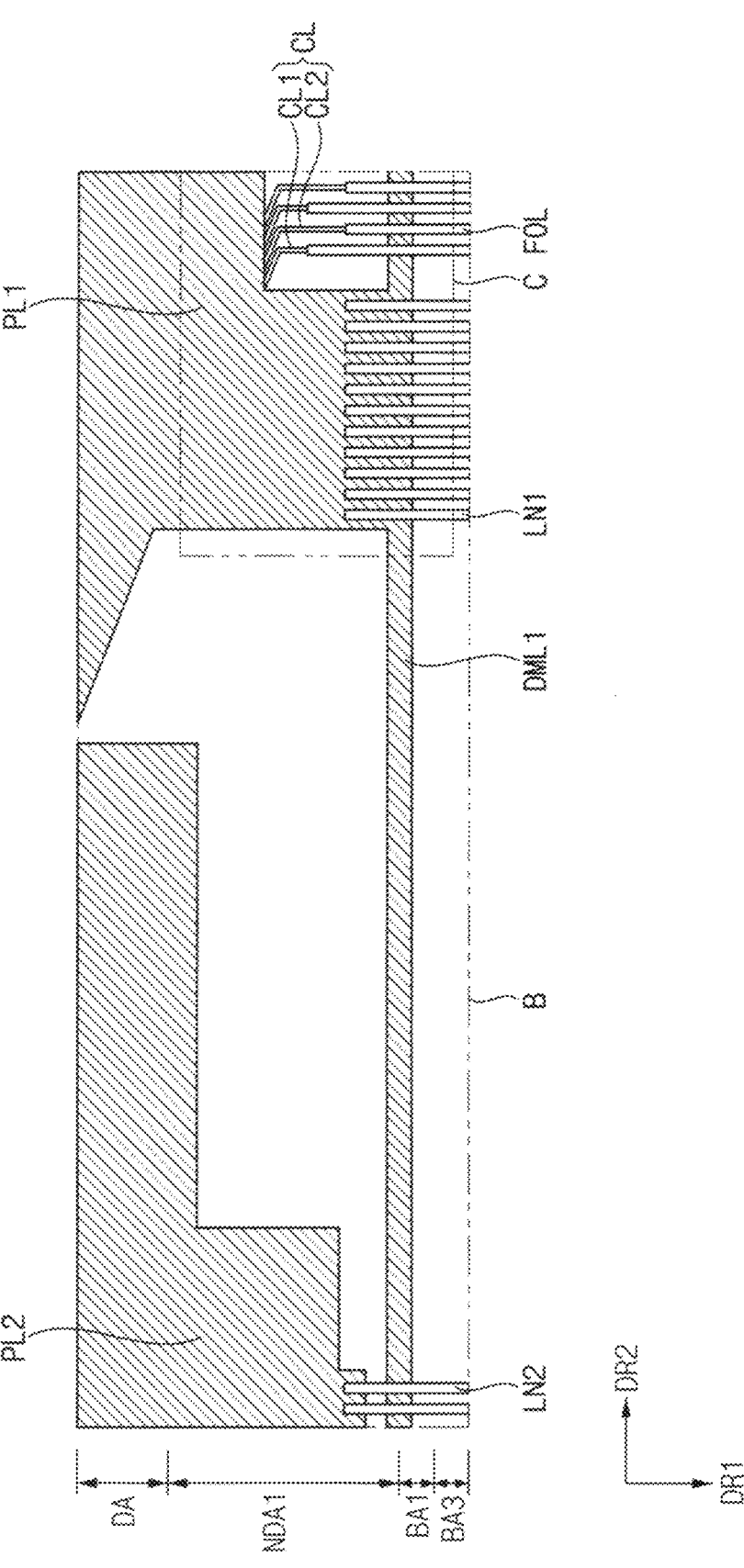
FIG. 6 is a plan view illustrating an enlarged area B of FIG. 1.
Figure 7:
FIG. 7 is a plan view illustrating an enlarged area C of FIG. 6.

FIG. 6 is a plan view illustrating an enlarged area B of FIG. 1. FIG. 7 is a plan view illustrating an enlarged area C of FIG. 6.

Referring to FIGS. 6 and 7, the first power line PL1, the second power line PL2, and the third power line PL3 may be disposed on the second inorganic film IF2. The second power line PL2 may be disposed on the same layer as the first power line PL1. The second power line PL2 may be spaced apart from the first power line PL1 in a plan view. Also, the second power line PL2 may be spaced apart from the first dummy line DML1 in the plan view. The second power line PL2 may overlap the first dummy line DML1 in the first direction DR1.

The second power line PL2 may transmit a second power voltage different from the first power voltage to the pixels PX. The second power line PL2 may be connected to the pad unit PD through the second lines LN2.

The display device 10 may further include fan-out lines FOL and connection lines CL. The fan-out lines FOL may be spaced apart from the first lines LN1 in the second direction DR2. The fan-out lines FOL may extend in the first direction DR1 and may be connected to the connection lines CL.

The fan-out lines FOL may be connected to the driving chip. Optionally, the fan-out lines FOL may be connected to the pad unit PD connected to the driving chip. The fan-out lines FOL may receive the data signal from the driving chip and transmit the data signal to the connection lines CL. The connection lines CL may be connected to the data lines DL disposed in the display area DA, respectively, and may transmit the data signal to the data lines DL.

The connection lines CL may include first connection lines CL1 and second connection lines CL2. The first connection lines CL1 and the second connection lines CL2 may be disposed on different layers. The first connection lines CL1 and the second connection lines CL2 may extend parallel to each other and may be alternately disposed.

Figure 8:
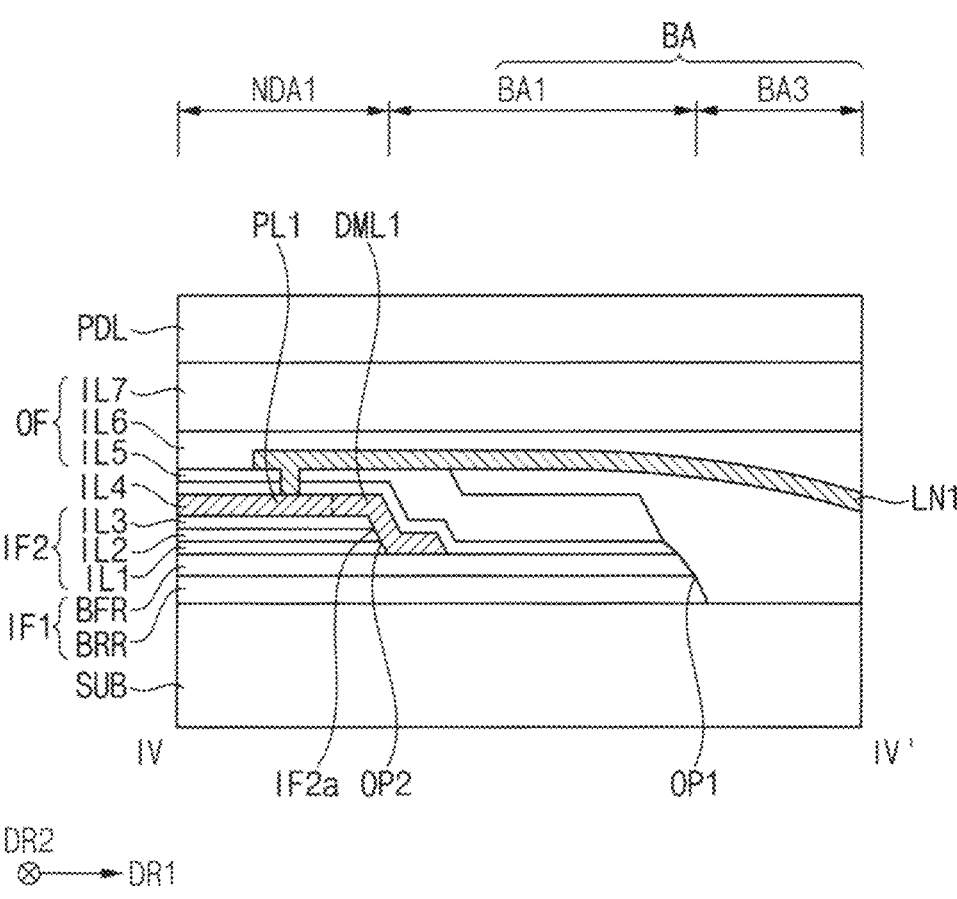
FIG. 8 is a cross-sectional view taken along line IV-IV' of FIG. 7.
Figure 9:
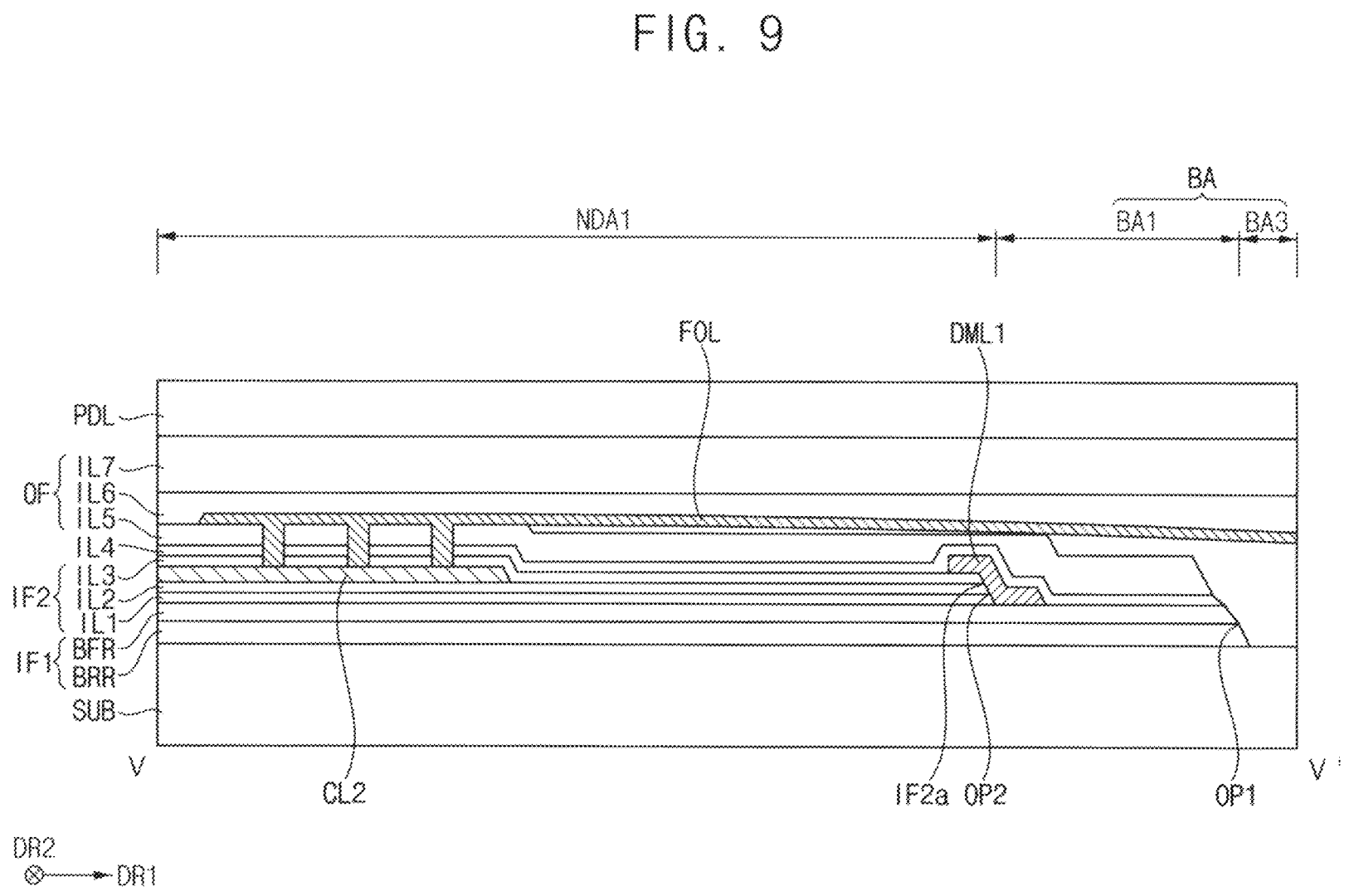

FIG. 8 is a cross-sectional view taken along line of FIG. 7. FIG. 9 is a cross-sectional view taken along line v-v' of FIG. 7.

Referring further to FIG. 8, the first lines LN1 may be disposed on the fifth insulation layer IL5. The first lines LN1 may be disposed on the same layer as the third conductive pattern CP3 and the fourth conductive pattern CP4 in the display area DA. The sixth insulation layer IL6 may cover the first lines LN1. The first lines LN1 may be connected to the first power line PL1 through at least one contact hole. The first lines LN1 may be connected to the third power line PL3. However, embodiments according to the invention are not limited thereto, and the first lines LN1 may be connected to the pad unit PD in another embodiment.

Referring further to FIG. 9, the fan-out lines FOL may be disposed on the same layer as the first lines LN1. For example, the fan-out lines FOL may be disposed on the fifth insulation layer IL5. The sixth insulation layer IL6 may cover the fan-out lines FOL.

The fan-out lines FOL may be connected to the connection lines CL, respectively. The fan-out lines FOL may be connected to the first connection lines CL1 and the second connection lines CL2 through contact holes, respectively.

The first connection lines CL1 and the second connection lines CL2 may be disposed on different layers. For example, the first connection lines CL1 may be disposed on the first insulation layer IL1. The second connection lines CL2 may be disposed on the second insulation layer IL2. For example, the first connection lines CL1 may be disposed on the same layer as the first gate line GWL, the second gate line GCL, and the first gate electrode GAT1 in the display area DA. The second connection lines CL2 may be disposed on the same layer as the second gate electrode GAT2. However, embodiments according to the invention are not limited thereto.

Figure 10:
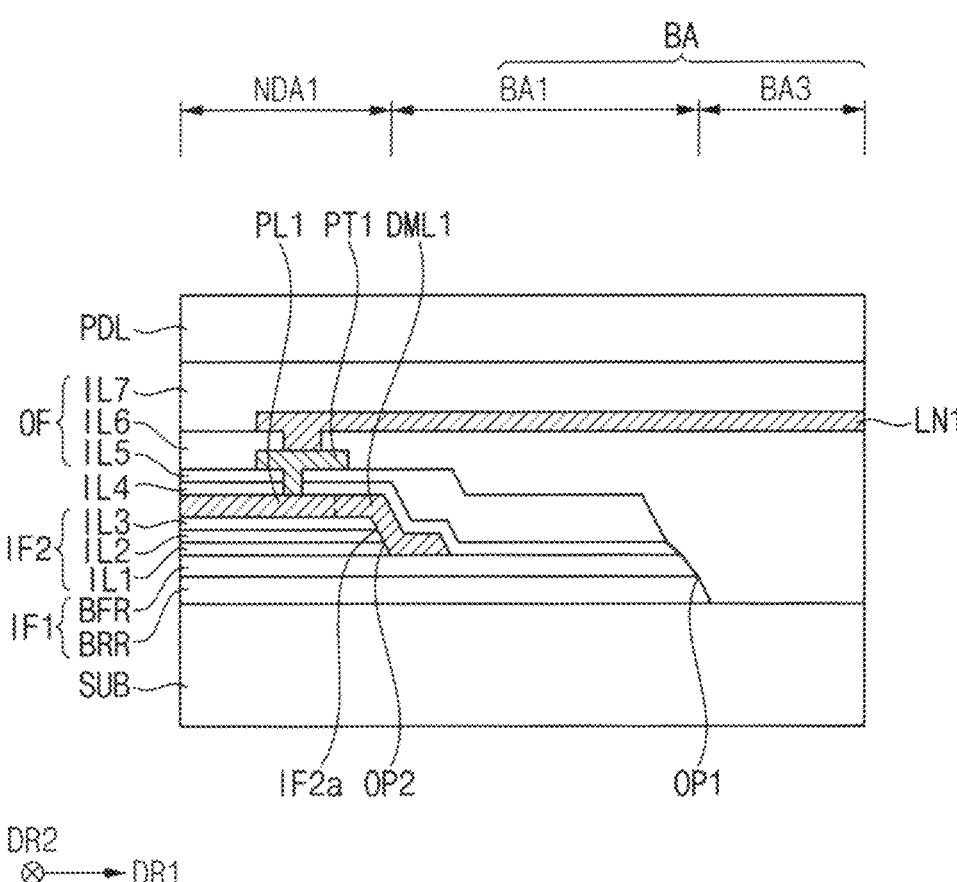
FIG. 10 is a cross-sectional view illustrating another example of FIG. 8.
Figure 11:
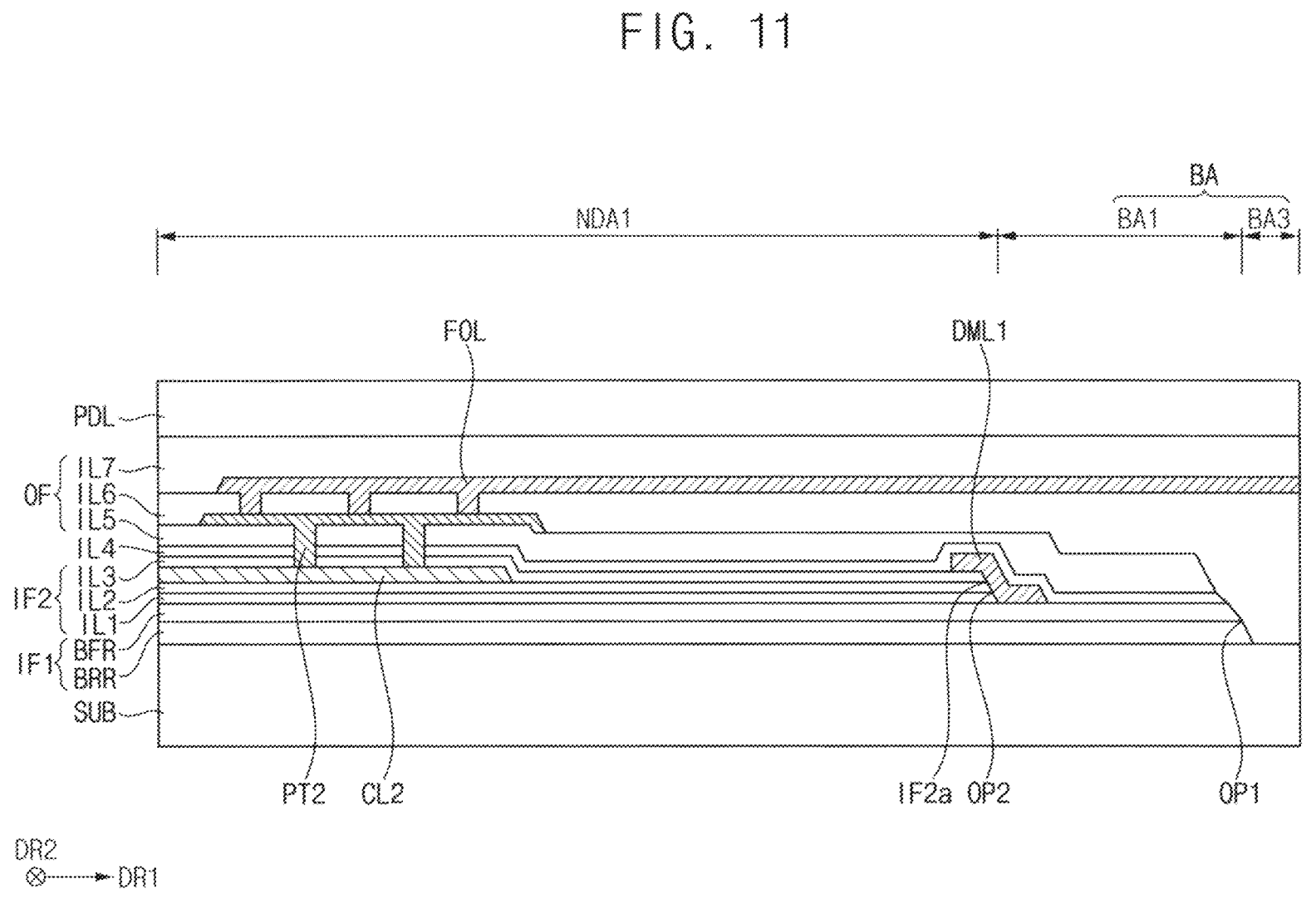

FIG. 10 is a cross-sectional view illustrating another example of FIG. 8. FIG. 11 is a cross-sectional view illustrating another example of FIG. 9.

In the embodiments described with reference to FIGS. 10 and 11, description overlapping with the embodiments described with reference to FIGS. 8 and 9 may be omitted.

Referring to FIGS. 10 and 11, first lines LN1 may be disposed on the sixth insulation layer IL6. The seventh insulation layer IL7 may cover the first lines LN1. Each of the first lines LN1 may be connected to the first power line PL1 through first patterns PT1. For example, the first lines LN1 may contact each of the first patterns PT1 through a contact hole penetrating the sixth insulation layer IL6. The first patterns PT1 may contact the first power line PL1 through a contact hole penetrating the fifth insulation layer IL5 and the fourth insulation layer IL4.

The fan-out lines FOL may be disposed on the same layer as the first lines LN1. The fan-out lines FOL may be disposed on the sixth insulation layer IL6. The seventh insulation layer IL7 may cover the fan-out lines FOL.

In an embodiment, for example, the first lines LN1 and the fan-out lines FOL may be disposed on the same layer as the data line DL in the display area DA.

The fan-out lines FOL may be connected to the connection lines CL, respectively. For example, the fan-out lines FOL may be connected to the second patterns PT2 through contact holes penetrating the sixth insulation layer IL6. The second patterns PT2 may be connected to the second connection lines CL2 through contact holes passing through the fifth insulation layer IL5, the fourth insulation layer IL4, and the third insulation layer IL3, respectively.

However, embodiments according to the invention are not limited thereto, and the fan-out lines FOL and the first lines LN1 may be disposed on different layers. in another embodiment FIGS. 12 to 19 are views for explaining a method of manufacturing a display device according to embodiments.

Figure 12:
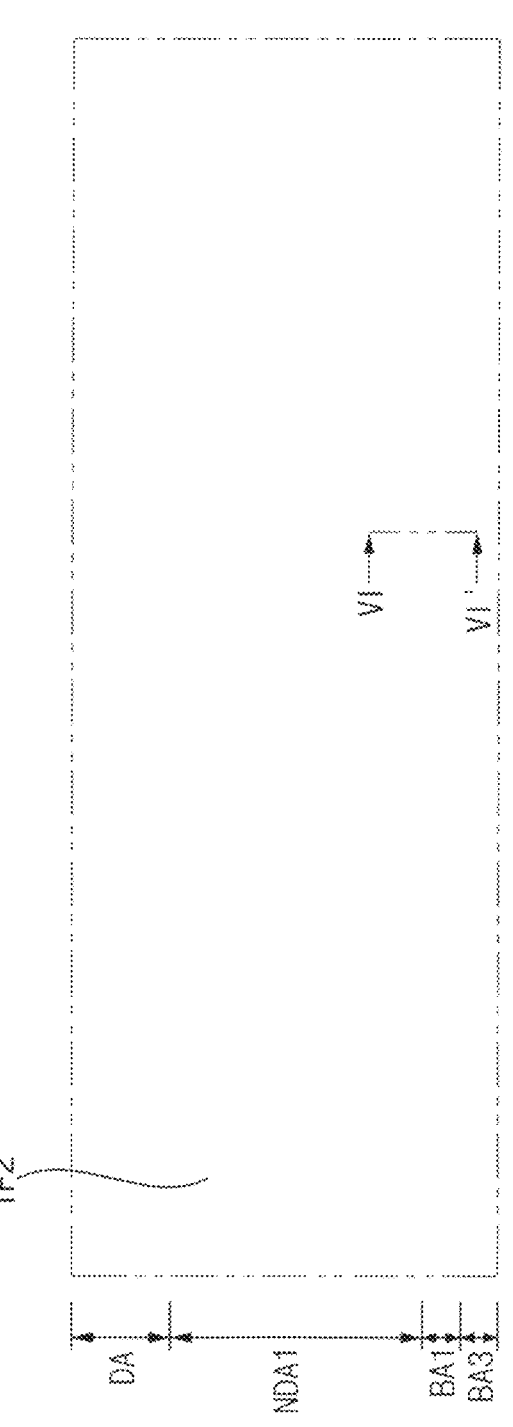
FIGS. 12 to 19 are views for explaining a method of manufacturing a display device according to embodiments.
Figure 12:
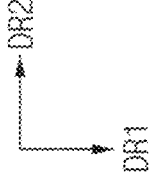
Figure 13:
Figure 13:
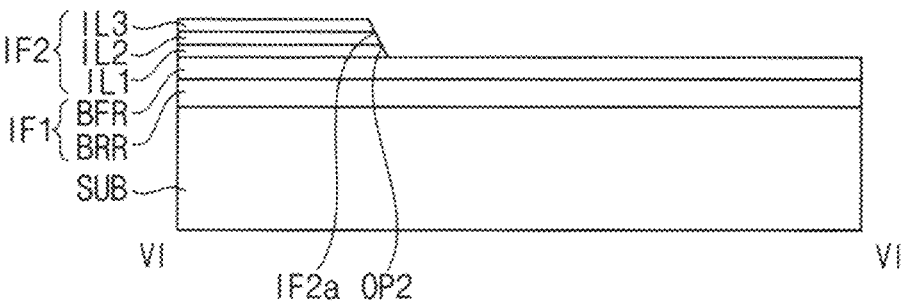
Figure 13:
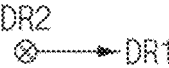
Figure 14:
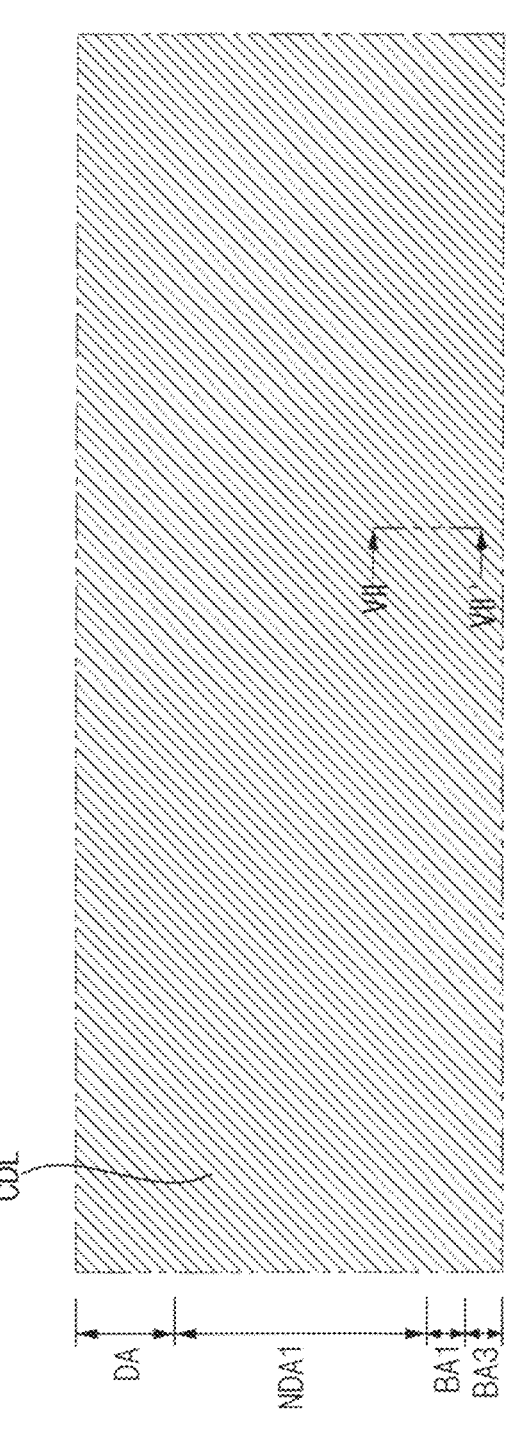
Figure 14:
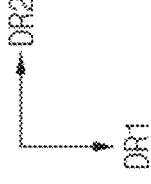
Figure 15:
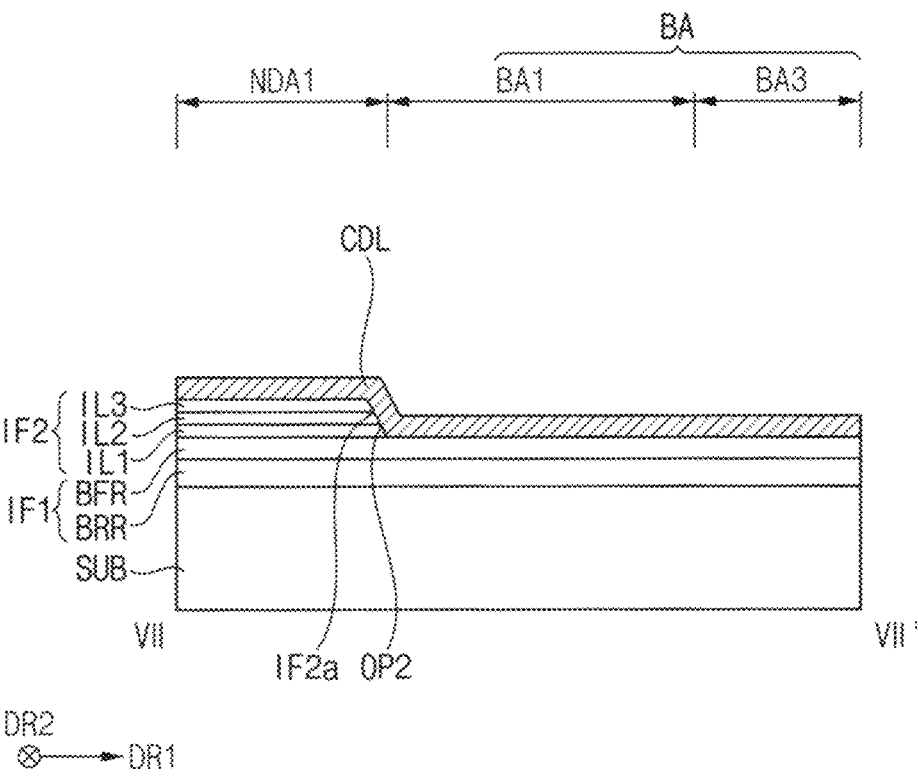
Figure 16:
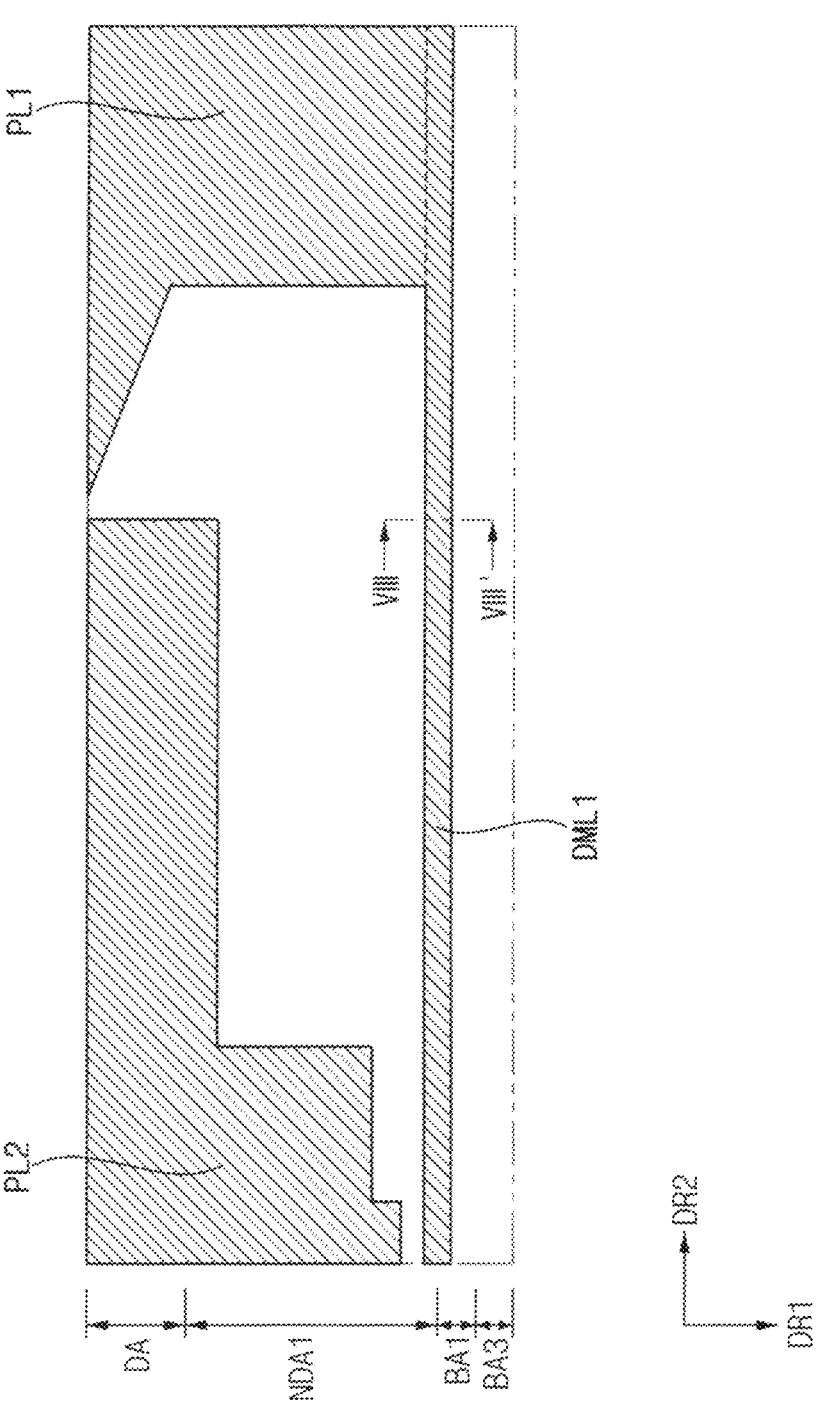
Figure 17:
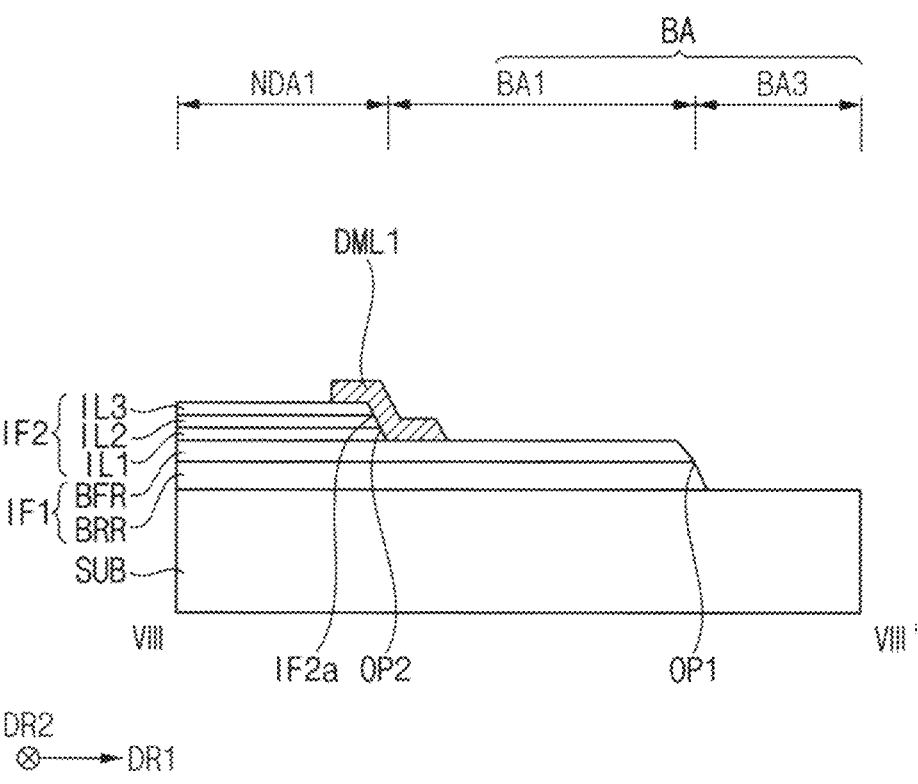

FIG. 13 is a cross-sectional view taken along line VI-VI' of FIG. 12, FIG. 15 is a cross-sectional view taken along line VII-VII' of FIG. 14. FIG. 17 is a cross-sectional view taken along line VIII-VIII' of FIG. 16 and FIG. 19 is a cross-sectional view taken along line IX-IX' of FIG. 18.

A method of manufacturing the display device described with reference to FIGS. 12 to 19 may be the method of manufacturing the display device 10 described with reference to FIGS. 1 to 11. Accordingly, overlapping descriptions may be omitted.

Referring to FIGS. 12 and 13, a substrate SUB may be prepared. The substrate SUB may include a display area DA, a first non-display area NDA1, a second non-display area NDA2, and a bending area BA. The bending area BA may include a first bending area BA1, a second bending area BA2, and a third bending area BA3.

A barrier layer BRR and a buffer layer BFR may be sequentially formed on the entire substrate SUB. The barrier layer BRR and the buffer layer BFR may form a first inorganic film IF1.

A first insulation layer ILL a second insulation layer IL2, and a third insulation layer IL3 may be sequentially formed on the first inorganic film IF1. The first insulation layer ILL the second insulation layer IL2, and the third insulation layer IL3 may form a second inorganic film IF2.

A portion of the second inorganic film IF2 which overlaps with the bending area BA may be removed. Accordingly, a second opening OP2 overlapping the bending area BA may be formed in the second inorganic film IF2.

Referring to FIGS. 14 and 15, a conductive layer CDL may be formed on the second inorganic film IF2. The conductive layer CDL may be entirely formed on the second inorganic film IF2, and may overlap the display area DA, the first non-display area NDA1, the second non-display area NDA2, and the bending area BA. The conductive layer CDL may include a metal.

Referring to FIGS. 16 and 17, the conductive layer CDL may form a first power line PL1, a second power line PL2, a third power line, a first dummy line DML1, and a second dummy line through a patterning process.

The first power line PL1, the second power line PL2, and the third power line may be formed to be spaced apart from each other. The first dummy line DML1 may be integrally formed (i.e., monolithic) with the first power line PL1. The second dummy line may be integrally formed with the third power line. The first dummy line DML1 and the second dummy line (e.g., the second dummy line DML2 of FIG. 3) may be formed to be spaced apart from each other in the first direction DR1.

The first dummy line DML1 may cover the first side surface IF2a of the second inorganic film IF2. That is, the first dummy line DML1 may be formed in a boundary between the first non-display area NDA1 and the bending area BA. The second dummy line may cover a second side surface (e.g., the second side surface IF2b of FIG. 5) spaced apart from the first side surface IF2a of the second inorganic film IF2 in the first direction DR1 and may be formed in a boundary between the second non-display area NDA2 and the bending area BA (refer to FIG. 3).

Each of the first dummy line DML1 and the second dummy line may be formed to extend in the second direction DR2.

After the conductive layer CDL is patterned, a portion of the first inorganic film IF1 which overlaps the third bending area BA3 included in the bending area BA may be removed. Accordingly, a first opening OP1 overlapping the third bending area BA3 may be formed in the first inorganic film IF1.

Figure 18:
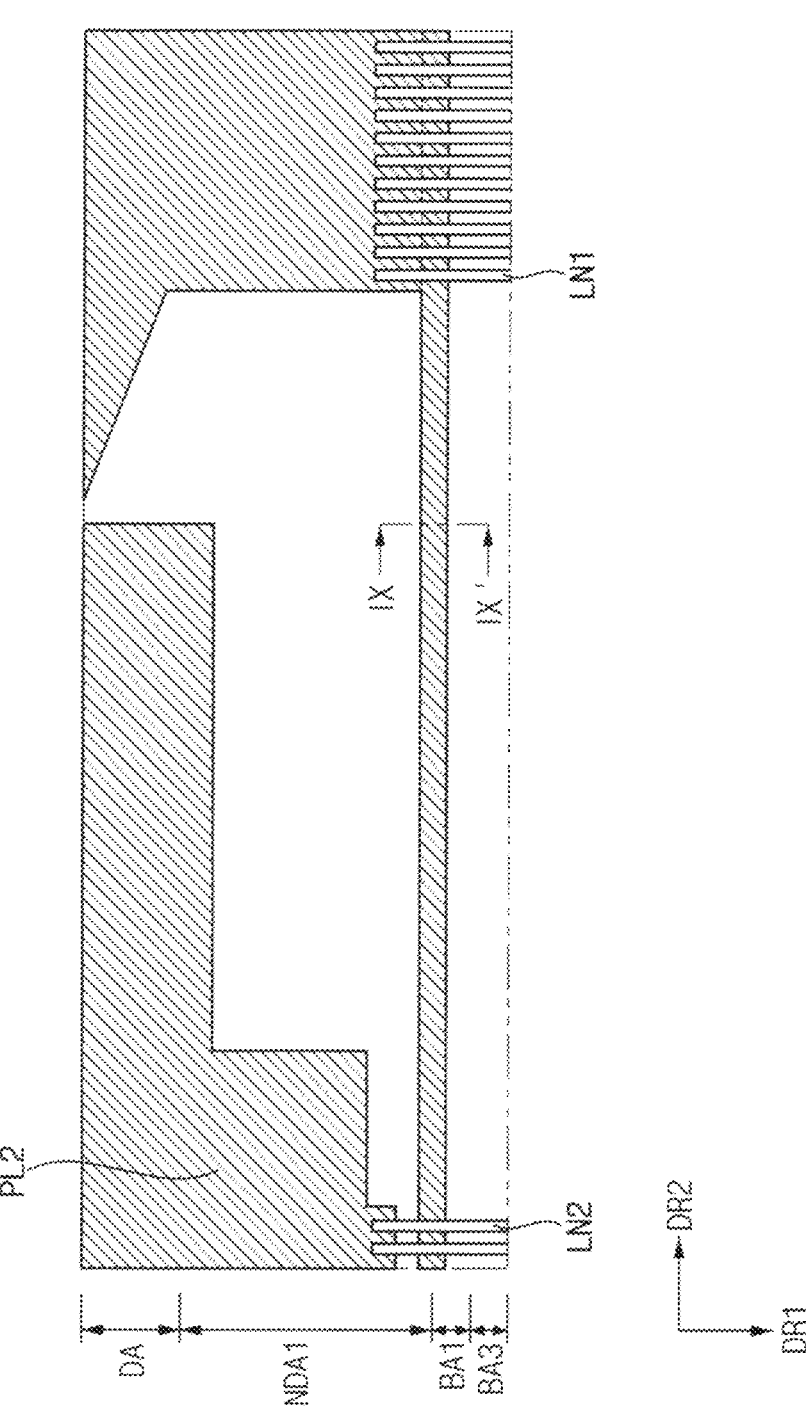
Figure 19:
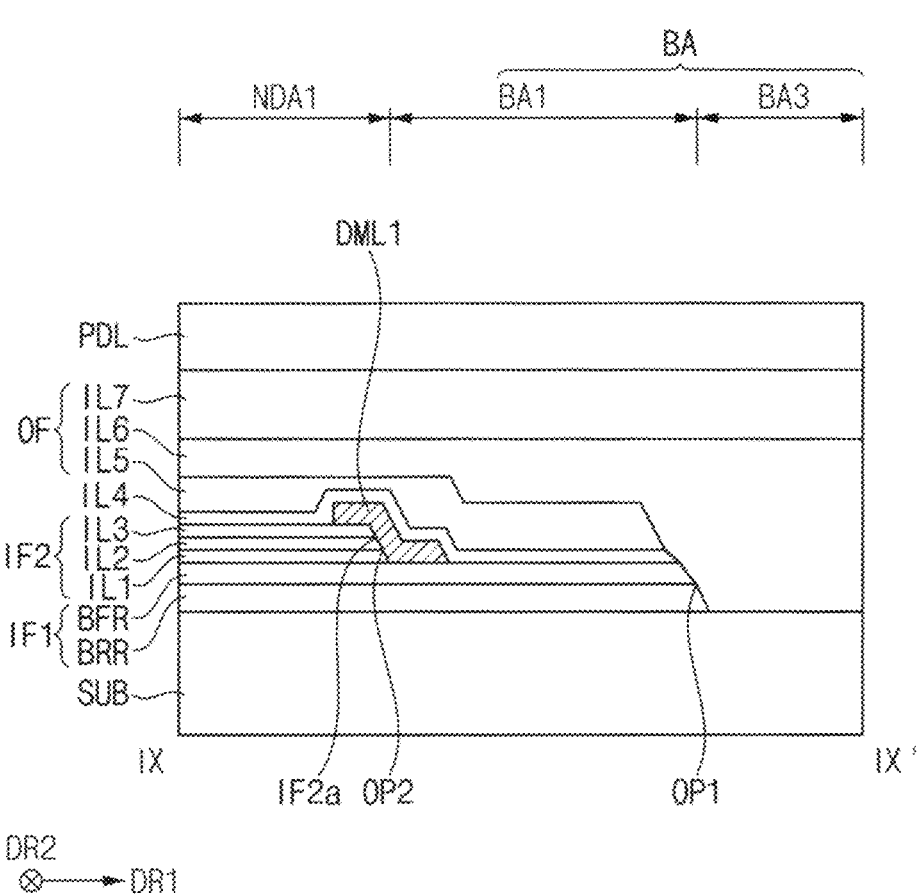

Referring to FIGS. 18 and 19, a fourth insulation layer IL4, a fifth insulation layer IL5, a sixth insulation layer IL6, and a seventh insulation layer IL7 may be sequentially formed to cover the first power line PL1, the second power line PL2, the third power line, the first dummy line DML1, and the second dummy line. The fifth insulation layer IL5, the sixth insulation layer IL6, and the seventh insulation layer IL7 may form an organic film OF.

In addition, first lines LN1, second lines, and fan-out lines FOL may be formed on the fifth insulation layer IL5 or the sixth insulation layer IL6. The first lines LN1 may be connected to the first power line PL1 through a contact hole or patterns (e.g., the first patterns PT1 of FIG. 10). The fan-out lines FOL may connect connection lines (e.g., the connection lines CL1 and CL2 of FIGS. 7, 9, and 11) through contact holes or patterns (e.g., the second patterns PT2 of FIG. 11).

The organic film OF may overlap the entirety of the display area DA, the first non-display area NDA1, the second non-display area NDA2, and the bending area BA, and may be formed in the first opening OP1 and the second opening OP2.

In an embodiment, as the first dummy line DML1 is formed in the boundary between the first non-display area NDA1 and the bending area BA and the second dummy line is formed in the boundary between the bending area BA and the second non-display area NDA2, it is possible to prevent residual metal film from remaining in the patterning process of the conductive layer CDL. Accordingly, a short circuit caused by the residual metal film may be prevented, and thus, the reliability of the display device may be improved.

The display device according to the embodiments may be applied to a display device included in a computer, a notebook, a mobile phone, a smartphone, a smart pad, a PMP, a PDA, an MP3 player, or the like.

Although the display device according to the embodiments have been described with reference to the drawings, the illustrated embodiments are examples, and may be modified and changed by a person having ordinary knowledge in the relevant technical field without departing from the technical spirit described in the following claims.

What is claimed is:

1. A display device comprising:
   a substrate including a display area, a first non-display area adjacent to the display area, a second non-display area spaced apart from the first non-display area in a first direction, and a bending area disposed between the first non-display area and the second non-display area and extending in a second direction crossing the first direction;
   a first inorganic film disposed in the display area, the first non-display area, the second non-display area and a portion of the bending area on the substrate;
   a second inorganic film disposed on the first inorganic film and overlapping the display area, the first non-display area, and the second non-display area in a plan view;
   a first power line disposed on the second inorganic film and overlapping the first non-display area in the plan view;
   a first dummy line extending from the first power line, disposed on the first inorganic film in the bending area, covering a first side surface of the second inorganic film in the first non-display area, and extending in the second direction; and
   a third power line disposed on the second inorganic film, overlapping the second non-display area, disposed on the same layer as the first power line, and spaced apart from the first power line in the first direction in the plan view.

2. The display device of claim 1, wherein the first dummy line is monolithic with the first power line.

3. The display device of claim 1, wherein the first dummy line extends along the bending area in the second direction, and
   a length of the first dummy line in the second direction is the same as a length of the bending area in the second direction.

4. The display device of claim 1, wherein the second inorganic film exposes the first inorganic film in the bending area, and
   the first inorganic film exposes the substrate in the bending area.

5. The display device of claim 4, wherein a length of a portion of the first dummy line overlapping the bending area in the first direction is less than a length of a portion of the first inorganic film overlapping the bending area in the first direction.

6. The display device of claim 1, further comprising:
   a second power line disposed in the first non-display area on the second inorganic film and spaced apart from the first power line in the plan view.

7. The display device of claim 6, wherein the second power line is disposed in a same layer as the first power line, and
   the second power line is spaced apart from the first dummy line in the plan view.

8. The display device of claim 7, wherein the second power line overlaps the first dummy line in the first direction.

9. The display device of claim 1, further comprising:
   an organic film disposed on the first power line and overlapping the display area, the first non-display area, the second non-display area, and the bending area.

10. The display device of claim 9, wherein the organic film covers the first dummy line, the first inorganic film and the second inorganic film.

11. The display device of claim 1, further comprising:
    a second dummy line extending from the third power line, disposed on the first inorganic film in the bending area, covering a second side surface of the second inorganic film spaced apart from the first side surface in the second non-display area, and extending in the second direction.

12. The display device of claim 11, wherein the second dummy line is spaced apart from the first dummy line in the first direction.

13. The display device of claim 12, wherein the second dummy line extends along the bending area in the second direction, and
    a length of the second dummy line in the second direction is the same as a length of the first dummy line in the second direction.

14. A display device comprising:
    a substrate including a display area, a first non-display area adjacent to the display area, a second non-display area spaced apart from the first non-display area in a first direction, and a bending area disposed between the first non-display area and the second non-display area and extending in a second direction crossing the first direction;

a first inorganic film disposed in the display area, the first non-display area, the second non-display area, and a portion of the bending area on the substrate and defining a first opening extending in the second direction in the bending area;

a second inorganic film in the display area, the first non-display area, and the second non-display area on the first inorganic film and defining a second opening extending in the second direction in the bending area;

a first power line disposed in the first non-display area on the second inorganic film;

a first dummy line extending from the first power line, disposed on the first inorganic film in the bending area, covering a first side surface of the second opening in the first non-display area, and extending in the second direction; and a third power line disposed on the second inorganic film, overlapping the second non-display area, disposed on the same layer as the first power line, and spaced apart from the first power line in the first direction in the plan view.

15. The display device of claim 14, wherein the first opening and the second opening overlap each other in the bending area in a plan view.

16. The display device of claim 14, wherein the first dummy line is spaced apart from the first opening.

17. The display device of claim 14, further comprising:

a second power line disposed in a same layer as the first power line and spaced apart from the first power line; and a second dummy line extending from the third power line, disposed on the first inorganic film in the bending area, covering a second side surface of the second opening in the second non-display area, and extending in the second direction.

18. The display device of claim 17, wherein the second dummy line is spaced apart from the first opening, the second dummy line is spaced apart from the first dummy line, and the first opening is interposed between the first dummy line and the second dummy line.

19. The display device of claim 14, further comprising:

an organic film disposed on the first power line and overlapping the display area, the first non-display area, the second non-display area, and the bending area, and wherein the organic film is disposed in the first opening and the second opening and contacts the substrate in the bending area.

* * * * *